US006417600B2

(12) United States Patent
Kitahara

(10) Patent No.: US 6,417,600 B2
(45) **Date of Patent: *Jul. 9, 2002**

(54) PIEZOELECTRIC VIBRATOR UNIT, METHOD FOR MANUFACTURING THE SAME, AND INK JET RECORDING HEAD COMPRISING THE SAME

(75) Inventor: Tsuyoshi Kitahara, Nagano (JP)

(73) Assignee: Seiko Epson Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/397,113

(22) Filed: Sep. 16, 1999

(30) Foreign Application Priority Data

Sep. 17, 1998 (JP) .......................................... 10-263119
Sep. 17, 1998 (JP) .......................................... 10-263120

(51) Int. Cl.[7] .............................................. H01L 41/08
(52) U.S. Cl. ...................................... 310/328; 310/366
(58) Field of Search ................................ 310/328, 366

(56) References Cited

U.S. PATENT DOCUMENTS 5,548,314 A * 8/1996 Okazawa et al. ............. 347/71
5,684,520 A * 11/1997 Morikoshi et al. ............ 347/70
5,755,019 A * 5/1998 Naka et al. ................ 29/25.35
5,786,833 A * 7/1998 Naka et al. .................... 347/71
5,945,773 A * 8/1999 Nagashima ................. 310/328
5,983,471 A * 11/1999 Osawa ...................... 29/25.35

FOREIGN PATENT DOCUMENTS

EP 0 573 055 A2 12/1993 .............. B41J/2/14
EP 0 678 384 A1 * 7/1996 ................. 310/366
EP 8-187848 * 7/1996 ................. 310/366
JP 3-270944 12/1991 ............ B41J/2/295
JP 4-1052 1/1992 ............ B41J/2/045
JP 6-8423 1/1994 ............ B41J/2/045
JP 6-188475 * 7/1994 ................. 310/366
JP 7-186379 7/1995 ............ B41J/2/045
JP 7-186383 7/1995 ............ B41J/2/045
JP 7-195688 8/1995 ............ B41J/2/045
JP 8-290568 11/1996 ............ B41J/2/045
JP 9-156100 6/1997 ............ B41J/2/045
JP 9-239977 9/1997 ............ B41J/2/045
JP 10-181014 7/1998 ............ B41J/2/045

* cited by examiner

*Primary Examiner*—Thomas M. Dougherty
(74) *Attorney, Agent, or Firm*—Sughrue Mion, PLLC

(57) ABSTRACT

Connection electrodes are formed to be located on the same plane as discrete internal electrodes, and to be exposed to the rear face while being insulated from the discrete internal electrodes. With the conductive relationship between the connection electrodes and common electrodes, the resistance of the common internal electrodes is reduced, and the size of the fixed area is also reduced accordingly.

17 Claims, 12 Drawing Sheets

PIEZOELECTRIC VIBRATOR UNIT, METHOD FOR MANUFACTURING THE SAME, AND INK JET RECORDING HEAD COMPRISING THE SAME

BACKGROUND OF THE INVENTION

The present invention relates to a piezoelectric vibrator unit where internal electrodes are laminated in parallel to a deforming axis of the vibrator, and in particular to the structure of the internal electrode, and also related to an ink jet recording head comprising the piezoelectric vibrator.

As is disclosed in Japanese Patent Publication No. 4-1052A, for an ink jet recording head employing a piezoelectric vibrator in a vertical vibration mode, an elastic plate is located with a narrow gap from the rear face of a nozzle plate in which a plurality of nozzles are formed, and piezoelectric vibrators having a piezoelectric constant d31 are brought into contact with the rear face of the elastic plate, so that the vibrators correspond to pressure generating chambers that are formed in a channel forming substrate.

With this arrangement, a drive signal is transmitted to the piezoelectric vibrators, and ink is led from a reservoir via an ink supply port to the pressure generating chambers. Then, transmission of a drive signal is halted, and the piezoelectric vibrators are expanded to exert pressure to the ink. As a result, ink droplets can be ejected from the nozzle orifices.

For such a recording head, multiple piezoelectric vibrators must be arranged at the pitches at which the nozzle orifices are arranged. Therefore, as in, for example, Japanese Patent Publication No. 7-195688A, one end of a single piezoelectric vibrator plate is fixed to a base, and slits are formed into strips from the free end to the area that is fixed to the base, so that the recording head is provided as a unit where multiple piezoelectric vibrators are fixed to the same base.

In each of the piezoelectric vibrators having a piezoelectric constant d31, a discrete internal electrode is exposed at the tip of only the free end, and a common internal electrode is exposed only at the rear end of the fixed area. A plurality of these electrodes are layered with piezoelectric material in between. The discrete internal electrodes are connected to a segment electrode for transmitting a signal for driving the piezoelectric vibrators, while the common internal electrodes are connected in common by a connection part that is formed in the fixed area, and are connected to common electrodes. The piezoelectric vibrators are connected via the segment electrodes and the common electrodes to an external driver.

However, to reduce manufacturing costs, the width of the fixed area must be so narrow that the piezoelectric vibrators can be mechanically secured. Thus, the connection area for the common internal electrode that connects the individual piezoelectric vibrators in common is short, and the resistance in the common connection area is increased. In addition, there is another problem that heat is generated due to Joule heat. To resolve these shortcomings, the width of the fixed area can be increased. However, a new problem will occur, such as warping during annealing, or increase in the material cost.

Further, the discrete internal electrodes of the drive piezoelectric vibrators are connected to the segment electrodes that are so formed as to be extended from the distal end to the fixed area of the piezoelectric vibrators, and the common internal electrodes are connected via a flexible cable to the common electrodes that are so formed as to be extended from the rear end to the fixed area of the dummy piezoelectric vibrators. With this arrangement, a drive signal is transmitted from an external drive circuit.

Therefore, this piezoelectric vibrators, or so-called dummy piezoelectric vibrators that are formed at least on the side end faces of the piezoelectric vibrators and that do not relate to ejection of ink droplets, are to be formed by cutting the end of a single piezoelectric vibrator plate, a first conductive layer, which is extended from the distal end to the obverse face and which serves as a segment electrode, and a second conductive layer, which is extended from the rear end to the obverse face and that serves as a common electrodes separate from the first conductive layer, must be formed in advance, and the process for forming these first and second conductive layers requires laboring costs.

SUMMARY OF THE INVENTION

It is therefore, a first object of the present invention to provide a piezoelectric vibrator unit that can reduce the resistance of a common internal electrode and reduce the size of a fixed area as small as possible, and that can improve the manufacturing yield and reduce the material cost.

It is a second object of the present invention to provide a piezoelectric vibrator unit in which segment electrodes and common electrodes can be constituted by forming a common conductive layer only on the distal end and the obverse face of the piezoelectric vibrator.

It is a third object of the present invention to provide a method for manufacturing the above piezoelectric vibrator unit.

It is a fourth object of the present invention to provide an ink jet recording head comprising the above piezoelectric vibrator unit.

According to a piezoelectric vibrator unit of the present invention, a piezoelectric vibrator plate is formed by laminating common internal electrodes and discrete internal electrodes with a piezoelectric material in between, while exposing the common internal electrodes at the rear end face of a fixed end and exposing the discrete internal electrodes at the distal end face of a free end. A region of the piezoelectric vibrator plate where is to be a non-vibration part of the piezoelectric vibrator is fixed to a fixation base. On the piezoelectric vibrator plate, a conductive layer is formed so as to extend from the distal end face to the obverse face of a fixed region in an area where drive piezoelectric vibrators are to be formed, and as to extend from the distal end face to the rear end face in an area in which dummy piezoelectric vibrators are to be formed. The piezoelectric vibrator plate is cut into strips by slits such that the conductive layer in the region where the drive piezoelectric vibrators are to be formed are separated from each other while the rear end of the vibrator plate is continuous. According to the configuration, the common electrodes that are connected to the common internal electrodes can be connected in parallel also to the electrodes for external connection. Therefore, the resistance of the common internal electrode can be reduced.

Furthermore, according to a piezoelectric vibrator unit of the present invention, provided is, a piezoelectric vibrator plate is formed by laminating common internal electrodes and discrete internal electrodes with a piezoelectric material in between, while exposing the common internal electrodes at the rear end face of a fixed end and exposing the discrete internal electrodes at the distal end face of a free end. A region of the piezoelectric vibrator plate where is to be a non-vibration part of the piezoelectric vibrator is fixed to a fixation base. On the piezoelectric vibrator plate, a conductive layer is formed so as to extend from the distal end face to the obverse face of a fixed region in an area where drive piezoelectric vibrators are to be formed, and as to extend from the distal end face to the rear end face in an area in which dummy piezoelectric vibrators are to be formed. In order to form the dummy piezoelectric vibrators, the drive piezoelectric vibrators, the common electrodes and the segment electrodes, the piezoelectric vibrator plate is cut into strips by slits such that the conductive layer in the region where the drive piezoelectric vibrators are to be formed are separated from each other while the rear end of the vibrator plate is continuous. According to the configuration, the common electrodes connecting to the common internal electrodes and the segment electrodes connecting to the discrete internal electrodes can be formed by dividing the conductive layer extending from the distal end face to the non-vibrating area with slits. Therefore, the conductive layer that is extended from the rear face to the obverse face need not be formed.

DETAILED DESCRIPTION OF THE PREFERRED EMBODIMENTS

Figure 1:
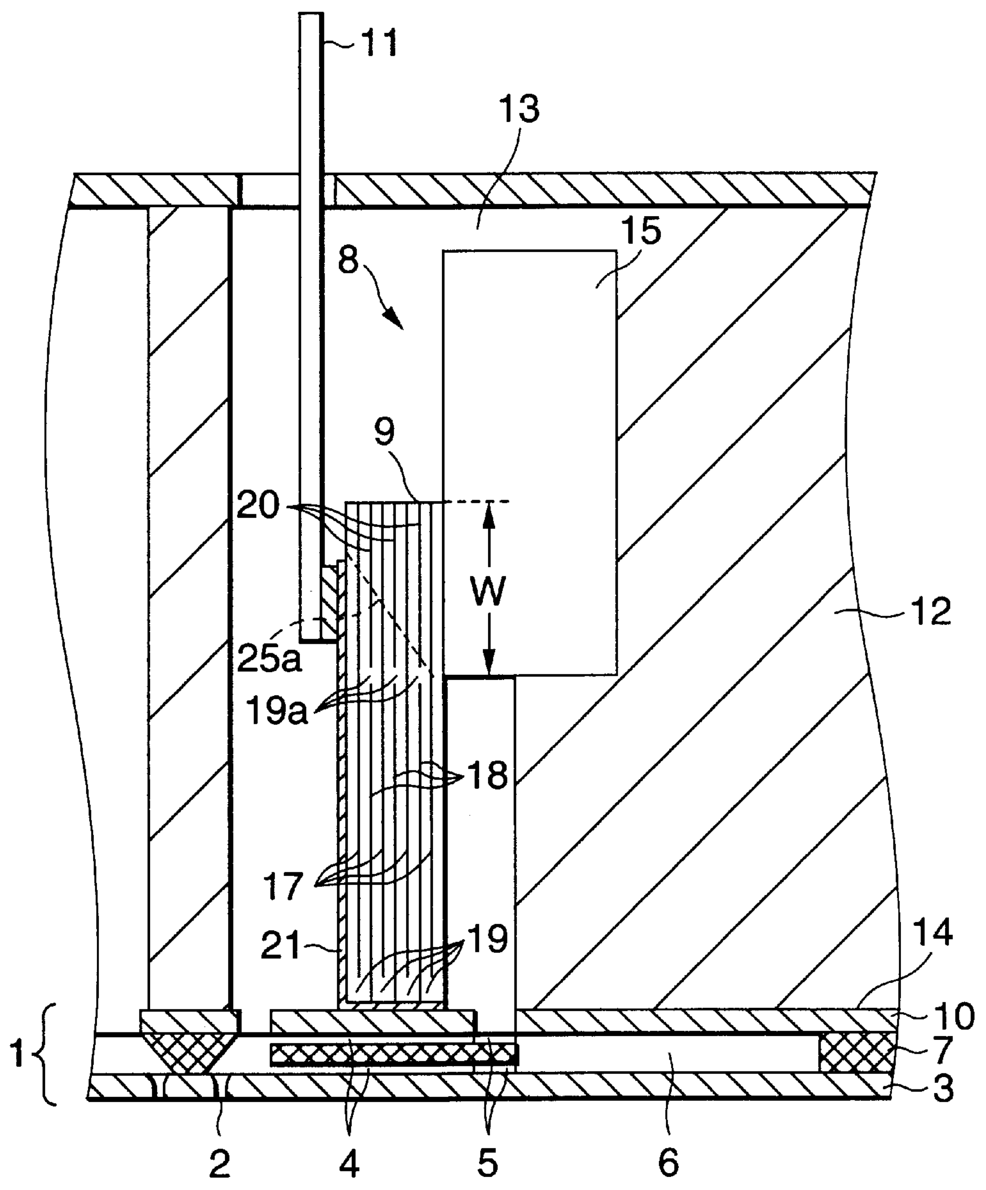
FIG. 1 is a cross-sectional view of the area of drive piezoelectric vibrators for an ink jet recording head according to a first embodiment of the present invention.

FIG. 1 is a diagram illustrating an ink jet recording head according to a first embodiment of the present invention. A channel unit 1 is constituted by integrally laminating a nozzle plate 3, in which nozzle orifices 2 are formed at a constant pitch, pressure generating chambers 4, which communicate with the nozzle orifices 2, a channel forming substrate 7, which includes a reservoir for supplying ink via an ink supply port 5 to the pressure generating chambers 4, and an elastic plate 10, which contacts the distal ends of piezoelectric vibrators 9 of the vertical vibration mode provided in a piezoelectric vibrator unit 8 in order to increase or reduce the volumes of the pressure generating chambers 4.

The piezoelectric vibrator unit 8 is stored and fixed to a retainer 13 of a head holder 12, while it is connected to a flexible cable 11 for transmitting an external drive signal, and the channel unit 1 is fixed to an opening face 14 of the holder 12, thereby constituting the recording head.

Figure 3:
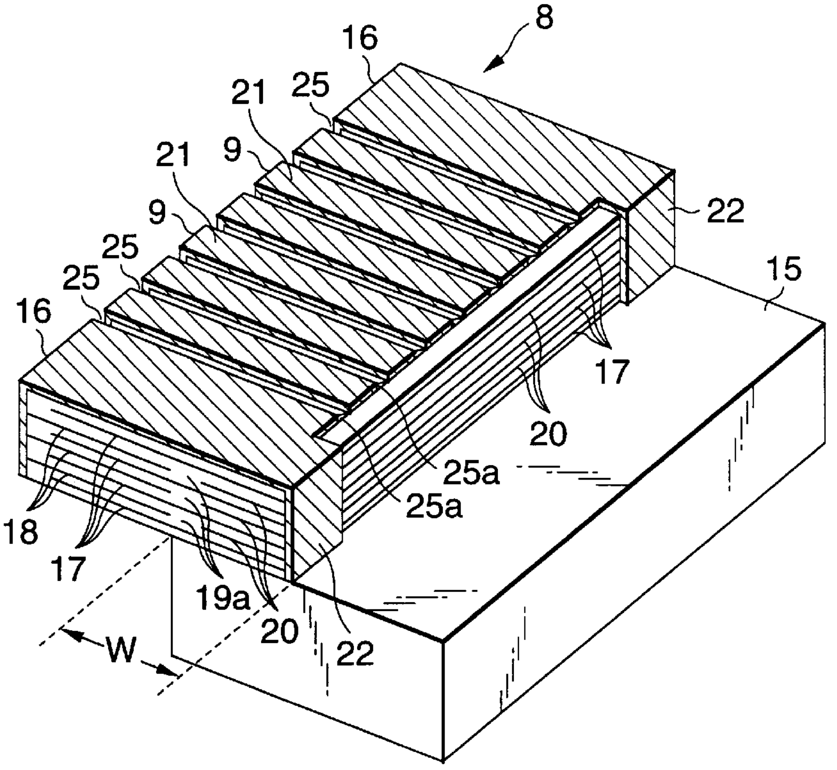
FIG. 3 is a diagram showing an example piezoelectric unit for the recording head.

As is shown in FIG. 3, the piezoelectric vibrator unit 8 is designed that the drive piezoelectric vibrators 9, which are formed in a first area of the vibrator plate and are driven by external driving signal, for ejecting ink droplets are fixed to a fixation base 15 in accordance with the pitches at which the pressure generating chambers 4 are arranged, and that slightly wider dummy piezoelectric vibrators 16, which are formed in a second area of the vibrator plate and are not driven by external driving signal, are located at both ends in the direction in which the piezoelectric vibrators 9 are arranged and are also fixed to the fixation base 15.

The piezoelectric vibrators 9 and 16 are constituted by laminating, like sandwiches, common internal electrodes 17 of the drive piezoelectric vibrators 9 and discrete internal electrodes 18 with a piezoelectric material in between, and by exposing the common internal electrodes 17 at the rear end face (first face) of the fixed end and exposing the discrete internal electrodes 18 at the distal end face (second face) of the free end.

Connection electrodes 20, which are independent of the common internal electrodes 17 and the discrete internal electrodes 18, are uniformly and continuously formed with a layer 19*a* made of the piezoelectric material 19 in the direction in which the piezoelectric vibrators 9 and 16 are arranged, so that the electrodes 20 are on the same plane as the discrete internal electrodes 18.

In the piezoelectric vibrator 9, a segment electrode 21 is formed extending toward the top face, so that a gap is defined between the distal face and a rear end face that is extended from the distal end to the fixed area. The discrete internal electrodes 18 are electrically led via the segment electrodes 21 to the fixed area.

Figure 2:
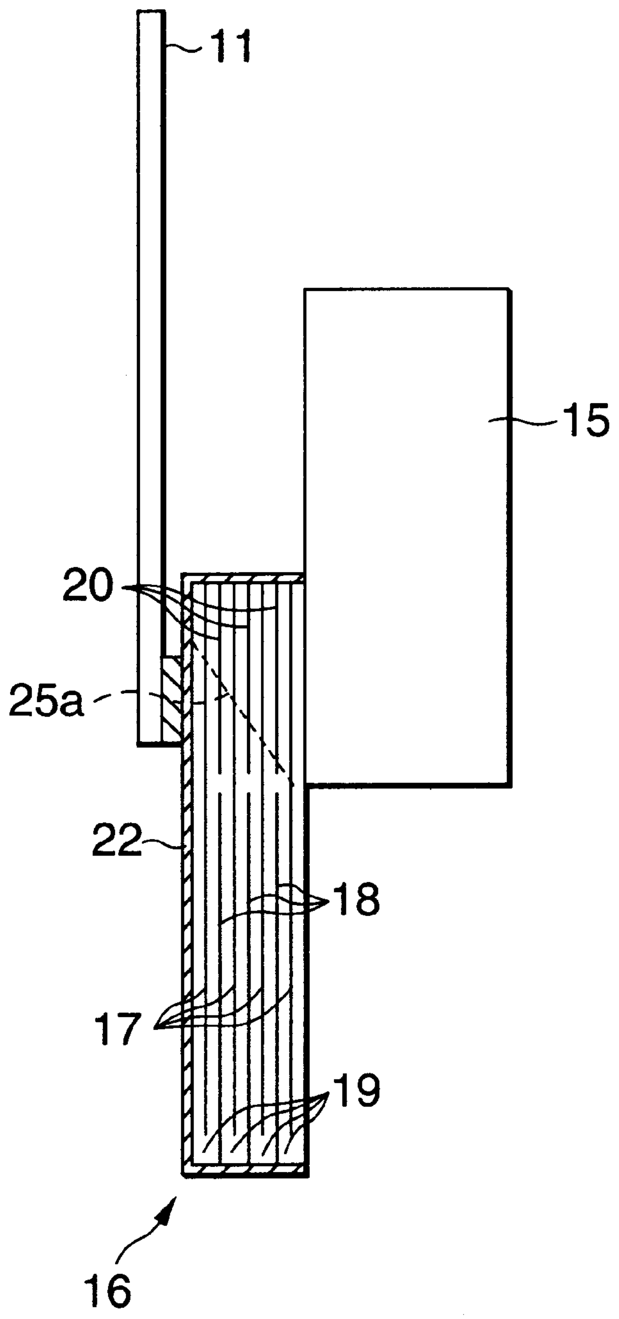
FIG. 2 is a diagram showing example dummy piezoelectric vibrators for the recording head.

Whereas, as is shown in FIG. 2, the dummy piezoelectric vibrator 16 is connected to a common electrode 22 that is extended at least from the rear face to the fixed area, and is electrically led to the fixed area.

Figure 4:
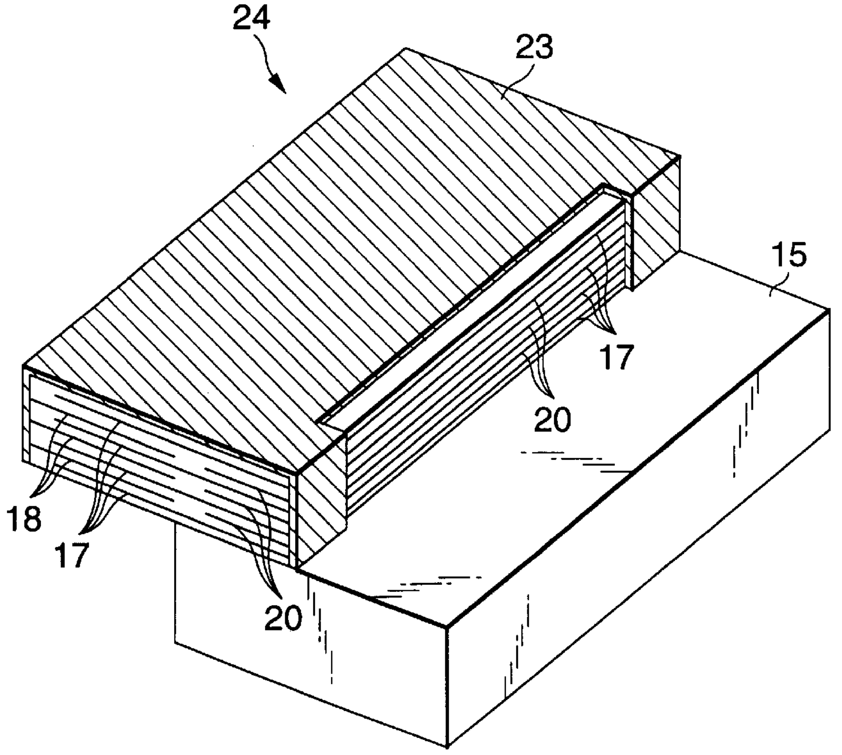
FIG. 4 is a diagram showing an example piezoelectric vibrator plate that is fixed to a fixation base before being cut.

To obtain the thus structured piezoelectric vibrator unit 8, as is shown in FIG. 4, a piezoelectric vibrator plate 24 is employed where a conductive layer 23 is not formed on the rear end faces in an area where the piezoelectric vibrators 9 are to be formed and in one part of an area extending from the rear end face to the partially obverse face. The piezoelectric vibrator plate 24 is cut into strips by forming slits 25 (see FIG. 2) having a slant bottom 25*a* using a wire saw, so that the conductive layer 23 in the area where the piezoelectric vibrators 9 are to be formed can be divided on the obverse face of the vibrator plate 24, and the area where the common internal electrodes 17 and the connection electrode 20 are fixed to the fixation base 15 is not cut on the reverse face of the vibrator plate 24. Thus, a continuous portion is provided for an area opposite the fixation base 15.

Figure 5:
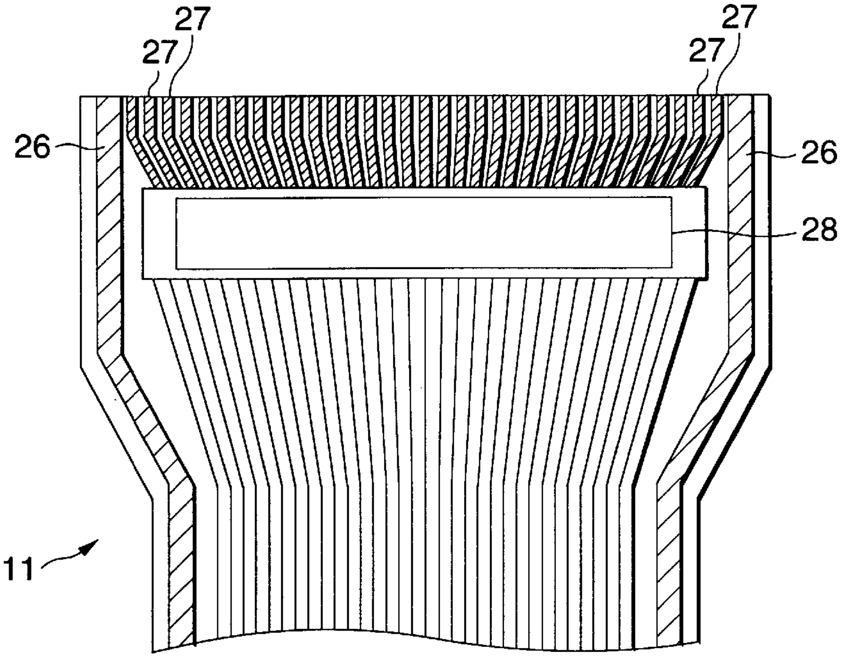
FIG. 5 is a diagram showing an example flexible cable used for the recording head.

FIG. 5 is a diagram showing an example flexible cable 11. Conductive patterns 26 connected to the common electrodes 22 are aligned on both sides of a base material, and conductive patterns 27 connected to the segment electrodes 21 are aligned in the central area, so that they are arranged at the pitches at which the drive piezoelectric vibrators 9 are arranged. Reference numeral 28 denotes a drive semiconductor integrated circuit.

The distal ends of the conductive patterns 26 and 27 are soldered in the area where the fixation base 15 for the dummy piezoelectric vibrators 16 and the piezoelectric vibrators 9 of the piezoelectric vibrator unit 8 are fixed, and at the position closer to the distal end than to the slits 25. The flexible cable 11 is thus fixed by conductive fixing means, such as a conductive adhesive or an anisotropic conductive bonding film, while a conductive relationship is established.

In this embodiment, when a drive signal is transmitted from an external drive circuit via the flexible cable 11, it is received by the internal common electrodes 17 via the common electrode 22 and by the discrete internal electrodes 18 via the segment electrode 21, and the piezoelectric vibrator 9 is extended or contracted in the axial direction. Thus, a specific pressure generating chamber 4 in the channel unit 1 is shrunk or expanded, and ink droplets are ejected from the nozzle orifices 2.

In this embodiment, since the common electrodes 22 connected to the common internal electrodes 17 are connected in parallel also by the connection electrodes 20 that are extended in the width direction of the piezoelectric vibrator unit 8, the resistance of the internal common electrode 17 for which the continuous area is reduced by formation of the slits 25 is reduced, and lowering of the level of the drive signal is prevented. As a result, width w of the fixed area for the common internal electrodes 17 can be accordingly reduced, so that the material cost can be reduced and the manufacturing yield can be improved.

In the above embodiment, since the rear end face of the drive piezoelectric vibrator 9 is sued as an area in which the common electrode 22 is not to be formed. However, as is shown in FIG. 6, a common electrode 22*b* may be so formed as to be connected to common electrodes 20*a* formed on the rear end face of the dummy piezoelectric vibrators 16 and to be separated from segment electrodes 21 of the piezoelectric vibrators 9 at a predetermined gap 29.

In this example, since the internal electrodes are connected in parallel not only by the connection electrode 20 but also by the common electrode 22*b*, the resistance can be reduced more. Further, since the rear edges of the internal common electrodes are covered with the electrode 22*b*, the piezoelectric vibrators 9 can be protected from humidity, and chipping of the edges in the job for connecting the flexible cable can be prevented.

Figure 6:
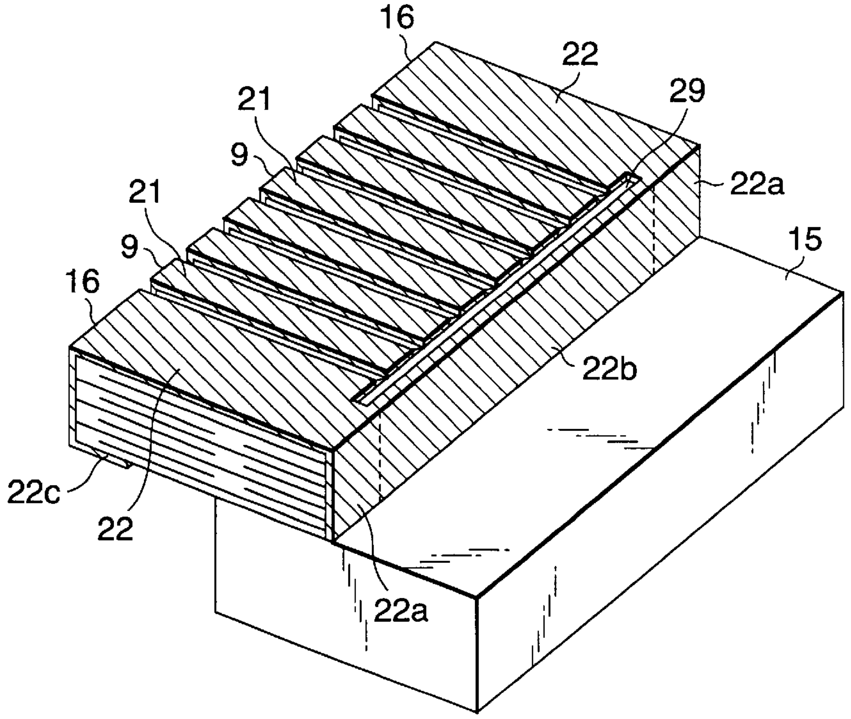
FIGS. 6 and 7 are diagrams showing other examples for the piezoelectric vibrator unit of the present invention.

The same effect can be obtained when an area 22*c* extending to the reverse face as shown in the dummy piezoelectric vibrators 16 in FIG. 6 may be formed for the segment electrodes 21 and the common electrodes 22 at the distal ends of the piezoelectric vibrators 9 and the dummy piezoelectric vibrators 16. Furthermore, when the common electrode 22 is so formed as to extend from the rear end of the piezoelectric vibrator 9 or 16 to the reverse face, i.e., to the fixation base, it is electrically connected to the conductive fixation base 15, so that the resistance can be reduced more. In addition, when the segment electrode 21 is formed extending from the distal end of the piezoelectric vibrator 9 to the reverse face, the impact applied during the assembly can be accepted also by the segment electrode 21 on the reverse face, and withstandability against the impact can be improved.

Figure 7:
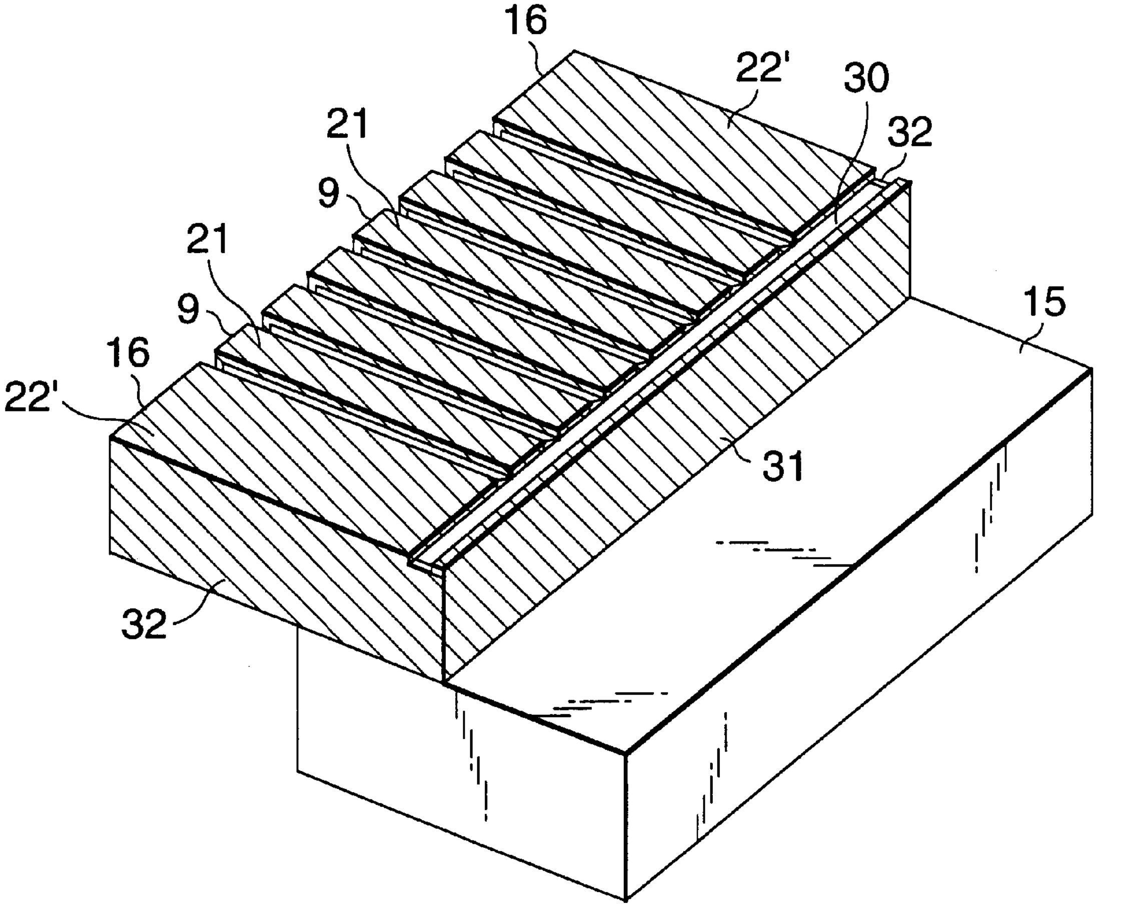

In the above embodiment, the electrode 22 is formed so that it continuous from the distal end face to the rear end face for the dummy piezoelectric vibrator 16. The same effect can be obtained by, as is shown in FIG. 7, forming an electrode 22' on the surface of the dummy piezoelectric vibrator 16 so that a constant gap from the rear end is defined as an piezoelectric material exposing portion 30, as in the segment electrode 21, and by forming electrodes 31 and 32 on the side face and the rear end face.

Figure 8A:
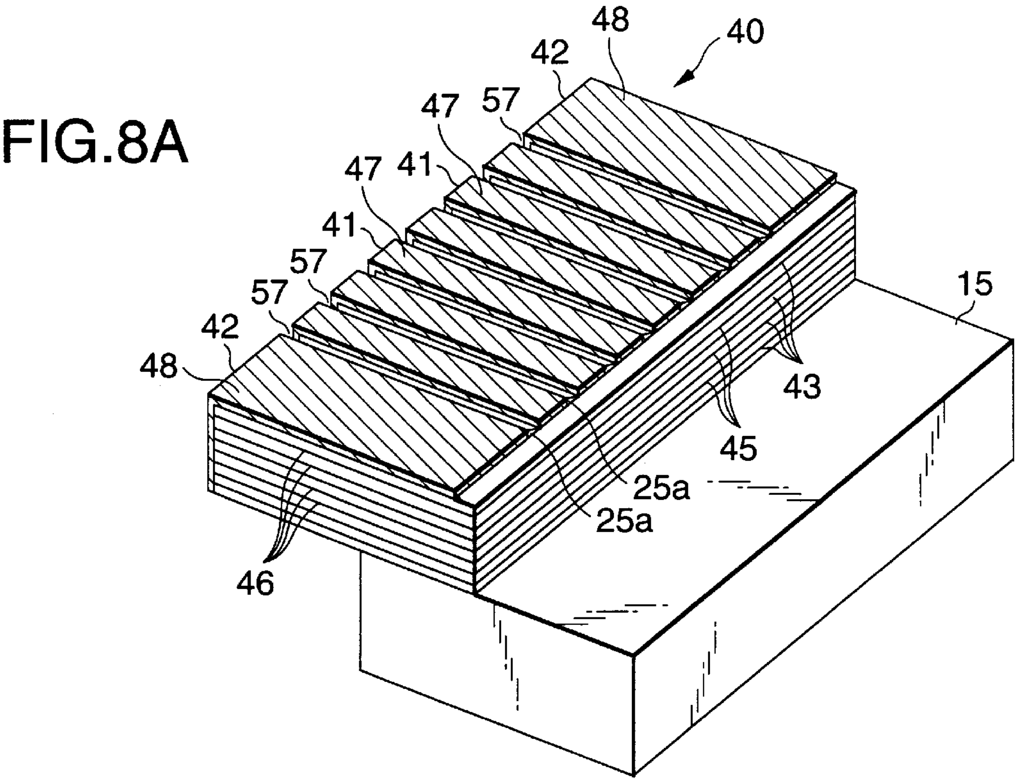
FIGS. 8A and 8B are diagrams showing another example piezoelectric unit for the recording head and the state where one of dummy piezoelectric vibrators are removed.
Figure 8B:
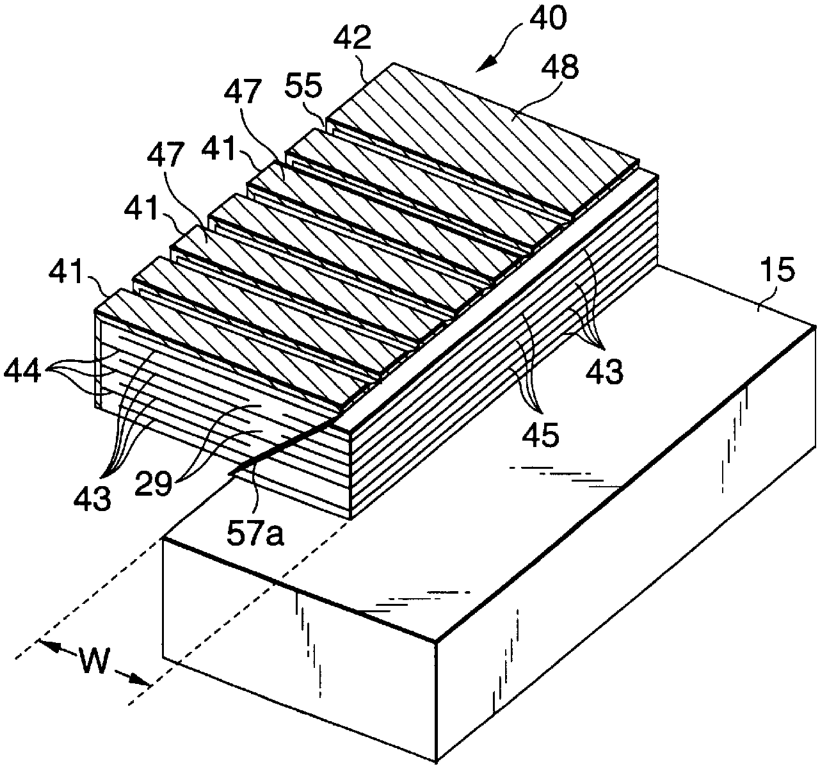

FIGS. 8A and 8B are diagrams showing a second embodiment of the present invention. A piezoelectric vibrator unit 40 is so designed that drive piezoelectric vibrators 41 for ejecting ink droplets are fixed to a fixation base 15 at the pitches at which pressure generating chambers 41 are arranged and that slightly wider dummy piezoelectric vibrators 42 are located at both ends in the direction in which the piezoelectric vibrators 41 are arranged and are fixed to the fixation base 15.

The drive piezoelectric vibrators 41 are so constituted that common internal electrodes 43 and discrete internal electrodes 44 are laminated like sandwiches with piezoelectric material layers 19 in between, and that the common internal electrodes 43 are exposed at the rear face of the fixed end, and the discrete internal electrodes 44 are exposed at the distal end face of the free end.

The piezoelectric material layers 19 are provided to form the same plane as the discrete internal electrodes 44, so that dummy electrodes 45, which are independent of the internal electrodes 43 and 44 with a separation part 29 between them, are continuously located in the arrangement direction of the piezoelectric vibrators 41. The dummy electrodes 45 are formed in order to maintain the constant annealing condition for forming a piezoelectric vibrator plate and to prevent the occurrence of warping.

Figure 9:
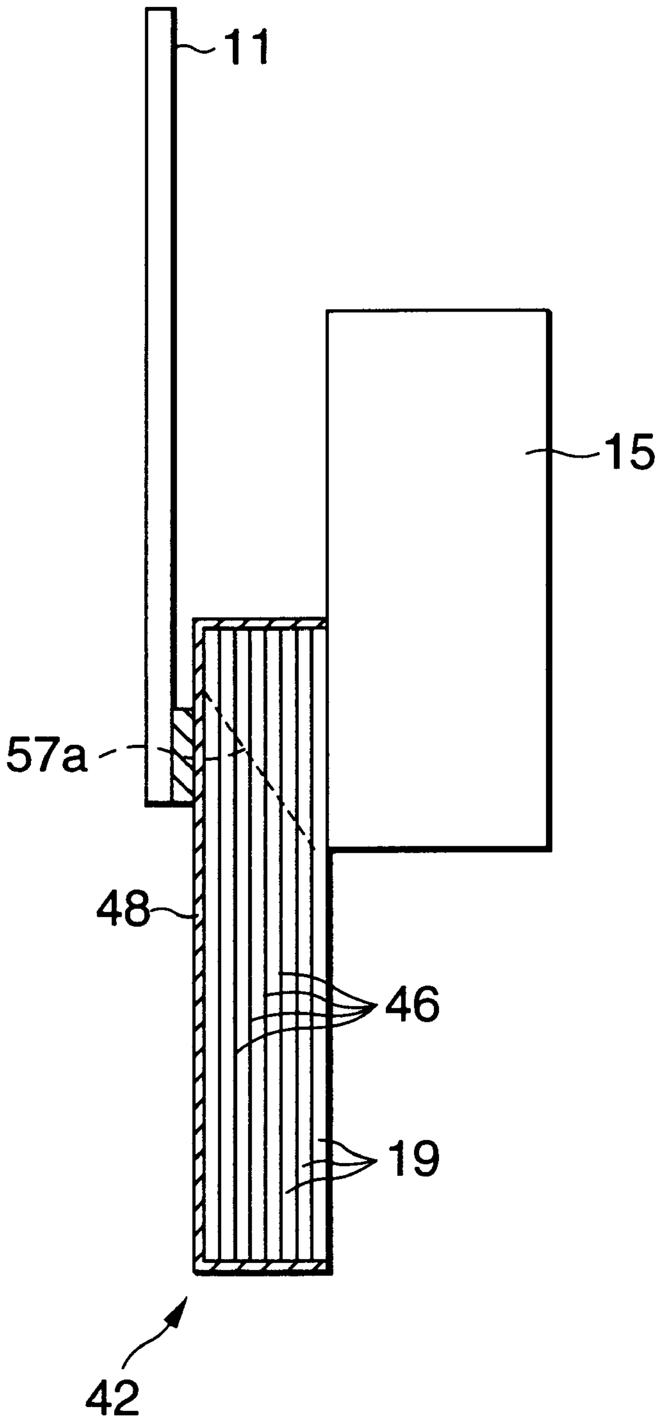
FIG. 9 is a cross-sectional view of the area of dummy piezoelectric vibrators for an ink jet recording head according to a second embodiment of the present invention.

As is shown in FIG. 9, for the dummy piezoelectric vibrator 42, electrodes 46 are formed on the same surface as the drive piezoelectric vibrators 41, being extended from the distal end to the rear end with the piezoelectric material 19 in between and exposed at both ends.

The distal end faces of the discrete internal electrodes 44 of the drive piezoelectric vibrator 41 are connected to a segment electrode 47 that is extended to the fixed area, i.e., a non-vibration area, and is led to the fixed area. The electrodes 46 of the dummy piezoelectric vibrator 42, as well as the piezoelectric vibrator 41, are led out to the fixed area by connecting to a common electrode 48 extending to the fixed area.

Figure 10A:
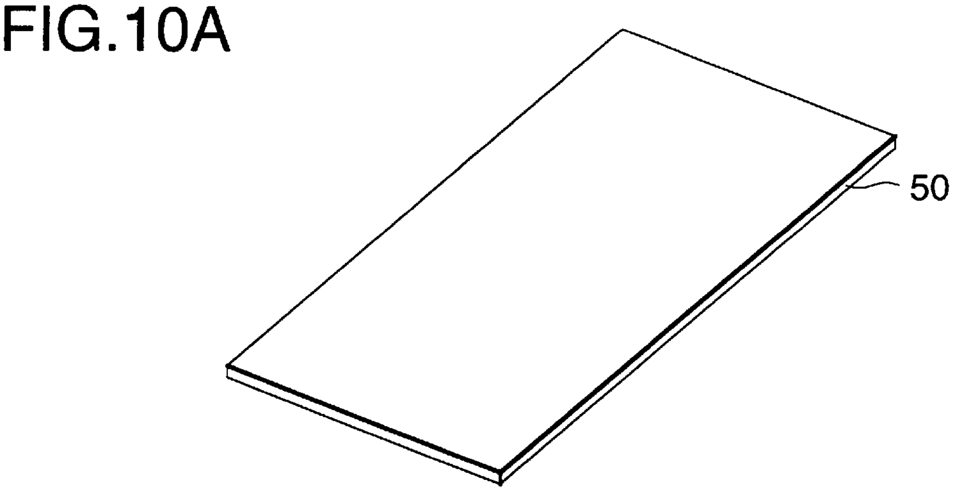
FIGS. 10A to 10C are diagrams showing the first-half processing for a method for manufacturing the above piezoelectric vibrator.
Figure 10B:
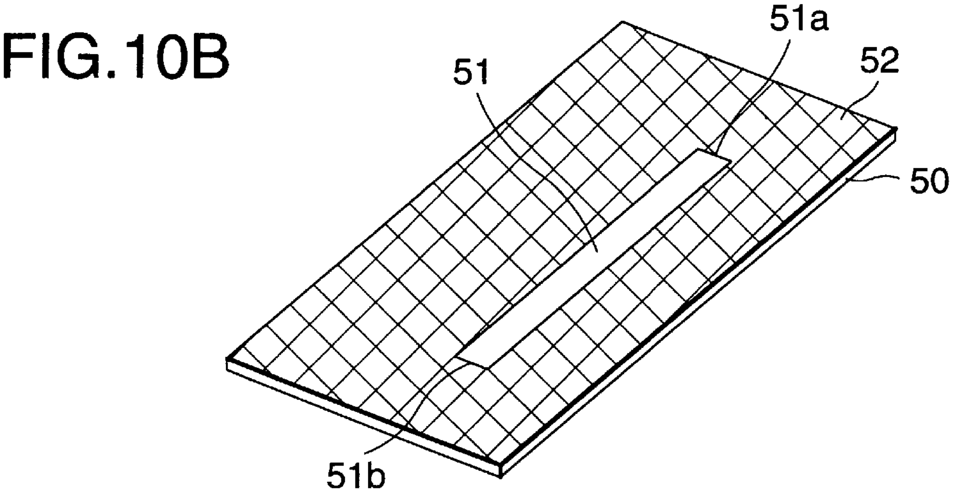

Such a piezoelectric vibrator unit is formed by depositing, on the surface of a table, a green piezoelectric sheet 50 that matches in size the piezoelectric vibrator plate (FIG. 10A), and by coating an area other than an area 51 that serves as the separation part 29 with a conductive material layer 52 containing silver palladium as a primary element (FIG. 10B).

Figure 10C:
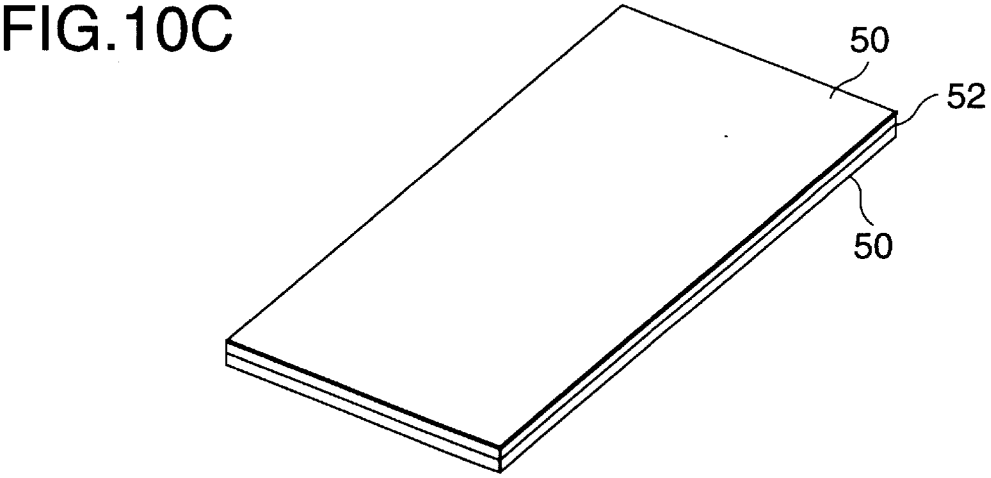
Figure 11A:
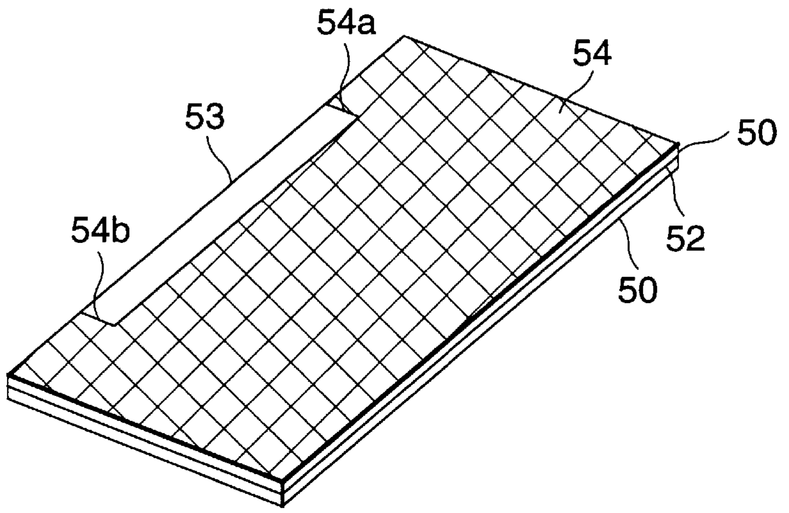
FIGS. 11A to 11B are diagrams showing the second-half processing for the method for manufacturing the above piezoelectric vibrator.
Figure 11B:
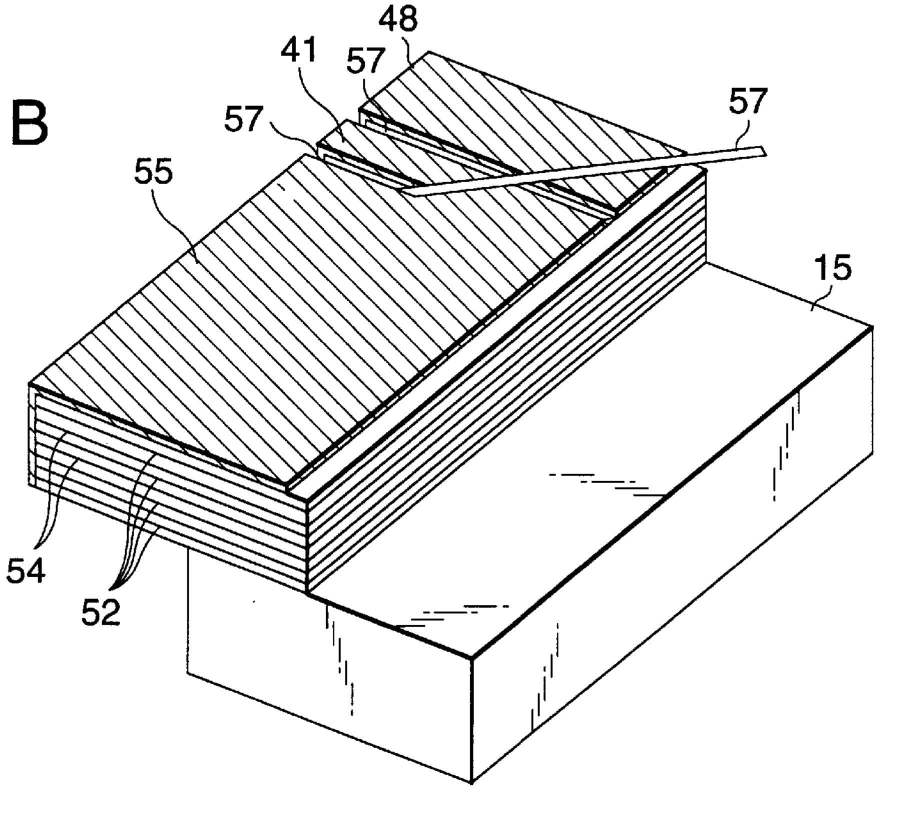

The green sheet 50 is deposited on the surface of the conductive layer 52 (FIG. 10C), and a conductive layer 54 is applied thereon, so that the distal end side for the piezoelectric vibrators in an area where the drive piezoelectric vibrators are to be formed serves as a conductive layer non-forming area 53 (FIG. 11A). Boundaries 54*a* and 54*b* inside the distal end of the conductive layer 54 correspond to boundaries 51*a* and 51*b* inside the area 51 that serves as the separation part 29.

A predetermined number of the conductive layers 52 and the conductive layers 54 are alternately laminated with the green piezoelectric sheets 50 in between, and the resultant structure is dried and annealed to form a single piezoelectric vibrator plate. A conductive layer 55 that serves as an external, electrode is formed on the surface where the piezoelectric vibrator plate is exposed and the distal end face by film deposition method, such as sputtering, and the non-vibration portion is fixed to the fixation base 15.

In this condition, the dummy vibrator 42 is cut, while a location corresponding to the end 51*a* of the area 51 that serves as the separation part is regarded as a strip cutting line. Then, in consonance with the width of the drive piezoelectric vibrators, slits 57 are formed by a cutting tool 56, such as a wire saw or a dicing saw, from the distal end to an area where the conductive layer 55 can be separated. Bottom faces 57*a* of the slits 57 are inclined so that, as is shown in FIG. 8B, the obverse side is positioned at the rear end and the reverse side is positioned at the distal end.

In this embodiment, when a drive signal is transmitted from an external drive circuit via the flexible cable 11, it is received by the common internal electrodes 43 via the common electrode 48 and the electrodes 46 of the dummy piezoelectric vibrator 42, and by the discrete internal electrodes 44 via the segment electrode 47. Then, the piezoelectric vibrator 47 is expanded or contracted in the axial direction thereof, and a specific pressure generating chamber 4 of the channel unit 1 is thus contracted or expanded, and ink droplets are ejected from the nozzle orifices 2.

Since the flexible cable 11 is bonded in the same band for the piezoelectric vibrators 41 and 42, the width w of the fixed area can be reduced, the material cost can be lowered and the manufacturing yield can be improved, compared with a case where the bonding area is shifted in the axial direction such as bonding at the distal end for the conventional piezoelectric vibrator and bonding at the rear end for the dummy piezoelectric vibrator 42.

In the above embodiments, the conductive layer is formed only the distal end face and the obverse face to provide the segment electrode 47 and the common electrode 48. However, when a conductive layer 60 is formed on the entire rear end face as is shown in FIG. 12, internal electrodes 43 and 45 are electrically connected to the common electrode 48 also via the conductive layer 60 and the electrode 46, so that the resistance can be reduced.

Figure 13:
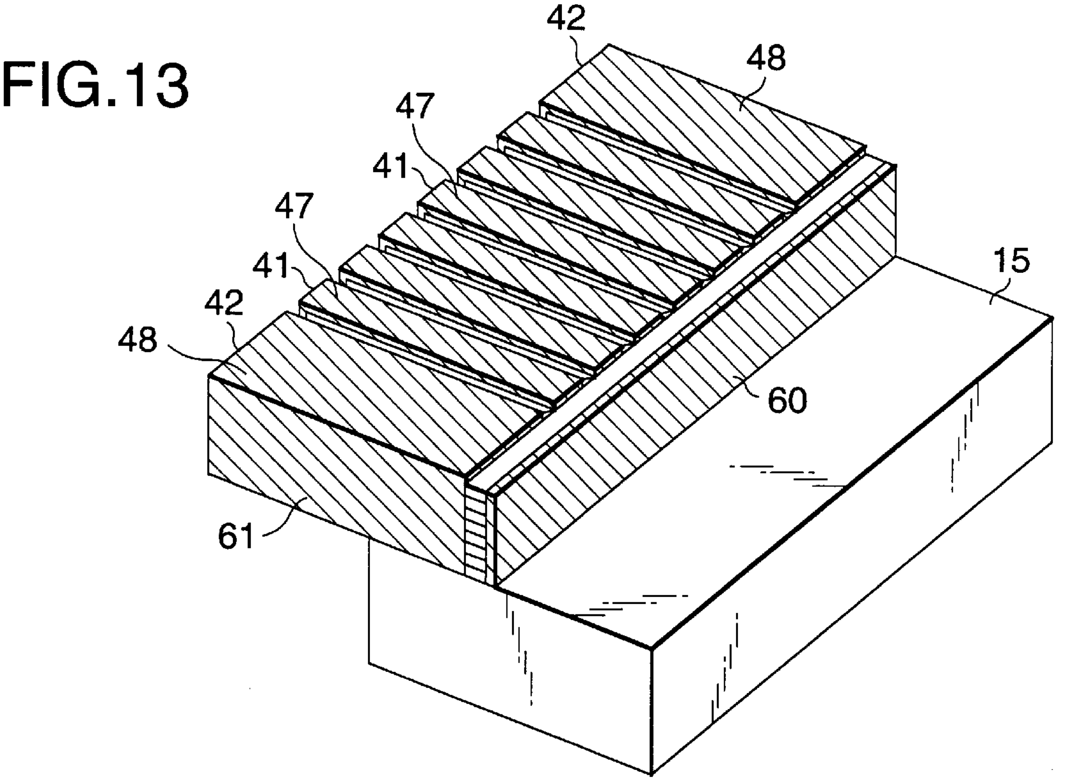
Figure 14:
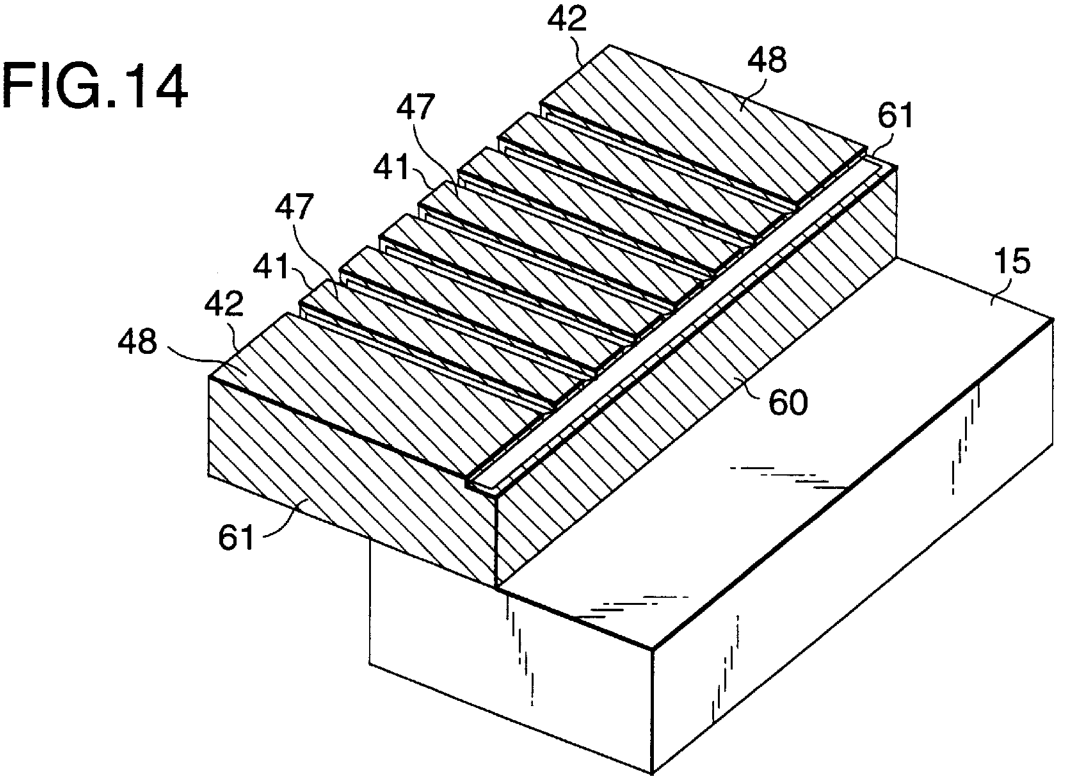

Further, when as is shown in FIG. 13 a conductive layer 61 is formed not only on the rear end face but also on the side faces of the dummy piezoelectric vibrators 42, or when as is shown in FIG. 14 a conductive layer 60 and a conductive layer 61 are continuously formed respectively on the entire rear face and on the side faces of the dummy piezoelectric vibrator 42, the connection resistance of the common electrode and the common internal electrode 44 can be reduced, and the conductive pattern 26 along the side of the flexible cable 11 (see FIG. 5) can be connected also to the side faces of the dummy piezoelectric vibrators 42 via the conductive layer 61, so that the degree of freedom for bonding the flexible cable and the piezoelectric vibrator unit can be increased. Furthermore, when the conductive layer 61 is formed extending to the reverse face of the piezoelectric vibrators 41 and 42, i.e., to the fixation base side, and is fixed to the fixation base that has at least the conductive obverse face, while the conductive relationship is established, the resistance can be reduced more.

Figure 12:
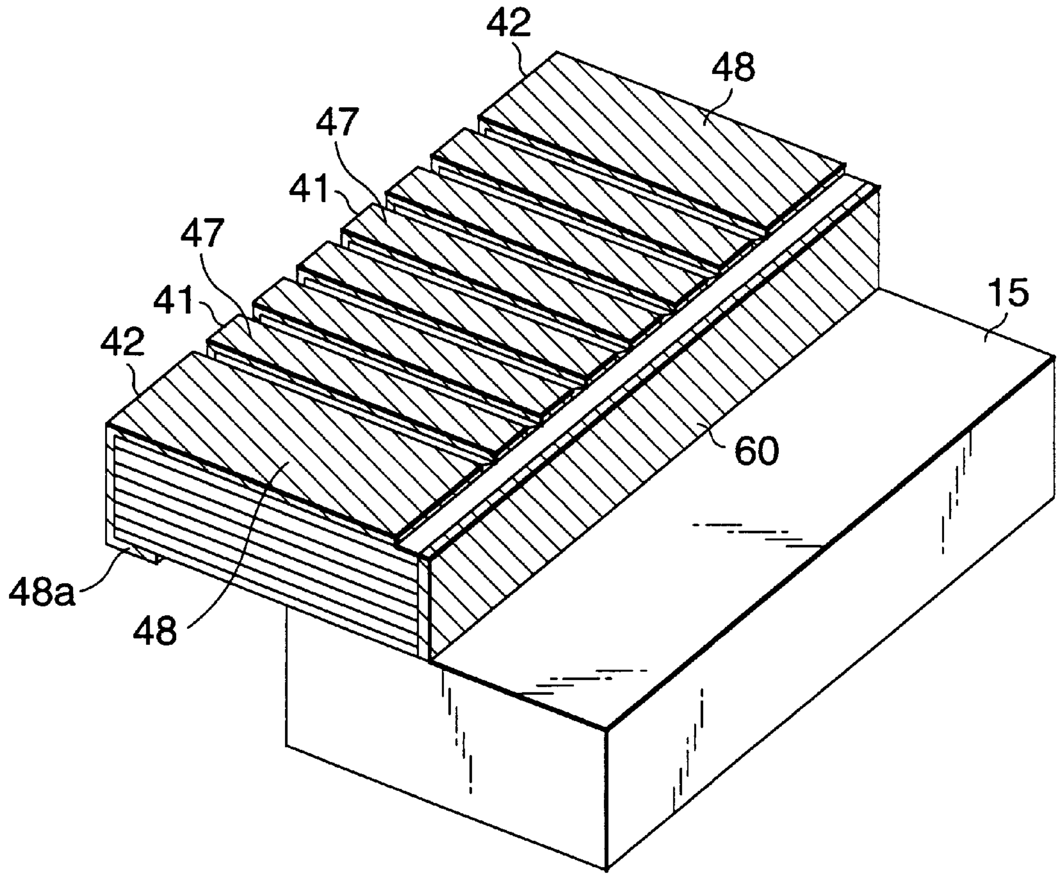
FIGS. 12 to 14 are diagrams showing other examples for the piezoelectric vibrator unit according to the present invention.

Further, as is shown in FIG. 12, an area 48*a* is formed for the segment electrode 47 and the common electrode 48, extending from the distal end to the reverse faces of the piezoelectric vibrators 41 and the dummy piezoelectric vibrators 42. Then, chipping of the distal end of the piezoelectric vibrator 41 or 42 during the assembly of the piezoelectric unit and the channel unit 1 can be prevented.

Figure 15:
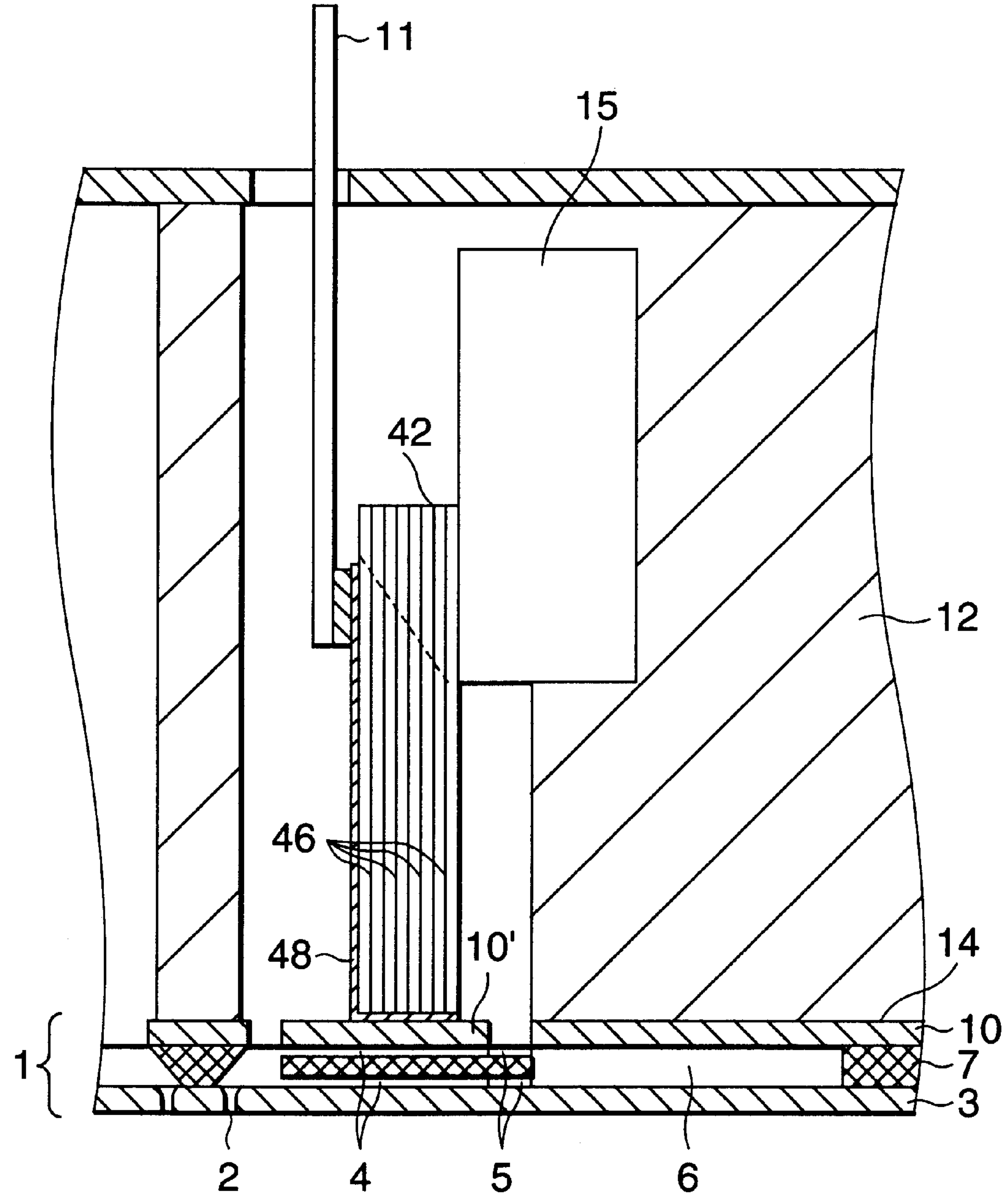
FIG. 15 is a cross-sectional view of the vicinity of the dummy piezoelectric vibrators for another ink jet recording head that is appropriate for the above piezoelectric vibrator unit.

FIG. 15 is a diagram showing an ink jet recording head that is appropriate for the above described piezoelectric vibrator unit. If an elastic plate 10 is formed of a conductive material, e.g., stainless steel, and only an island portion 10' that contacts the distal end of the dummy piezoelectric vibrator 42 is formed of conductive layer, e.g., stainless steel, the common electrode 48 has a conductive relationship with the island portion 10' and the elastic plate 10. Thus, when the elastic plate 10 is connected to an external drive circuit, a drive signal can be transmitted via the segment electrode 47 and the flexible cable 11 to the discrete internal electrodes 44 of the drive piezoelectric vibrator 41, and via the elastic plate 10 and the island portion 10' to the common internal electrodes 43. In this case, as previously mentioned, when a drive signal is received by connecting the common electrode 48 to the flexible cable 11, the resistance across the transmission path can be reduced.

What is claimed is:

1. A piezoelectric vibrator unit comprising:

drive piezoelectric vibrators composed of common internal electrodes and discrete internal electrodes laminated with piezoelectric material layers in between;

dummy piezoelectric vibrators including at least common internal electrodes and piezoelectric material layers;

a fixation base on which one end portions of the drive piezoelectric vibrators and the dummy piezoelectric vibrators are fixed such that the other end portions therefor are to be free ends; and a conductive layer electrically connected to all internal electrodes of the dummy piezoelectric vibrators, including the common internal electrodes, wherein said conductive layer is a common electrode that supplies a common potential to said common internal electrodes of said dummy piezoelectric vibrators, and wherein said one end portions of the drive piezolectric vibrators and the dummy piezoelectric vibrators, which are fixed on the fixation base, are made continuous with each other to form a continuous region in which the common internal electrodes are integrated and the piezoelectric material layers are integrated.

2. The piezoelectric vibrator unit as set forth in claim 1, wherein the drive piezoelectric vibrators and the dummy piezoelectric vibrators are separated from each other by grooves each having slanted bottom which defines a part of the continuous region.

3. The piezoelectric vibrator unit as set forth in claim 2, wherein the grooves are formed such that the slanted bottom face extends from obverse faces of the vibrators to back faces thereof while closing to the free end portions of the vibrators.

4. The piezoelectric vibrator unit as set forth in claim 1, wherein the conductive layer is formed on the dummy piezoelectric vibrators and the fixed end faces of respective vibrators.

5. The piezoelectric vibrator unit as set forth in claim 4, wherein the conductive layer formed on the dummy piezoelectric vibrators are separated from the conductive layer formed on the drive piezoelectric vibrators.

6. The piezoelectric vibrator unit as set forth in claim 1, wherein the conductive layer is formed on the free end faces of the drive and dummy piezoelectric vibrators and extends to at least a part of back faces of the drive and dummy piezoelectric vibrators, and wherein the back faces are adjacent to the one end portions fixed to the fixation base.

7. The piezoelectric vibrator unit as set forth in claim 1, wherein a conductive layer is formed on obverse faces, the free end faces and the side faces of the dummy piezoelectric vibrators, and the fixed end portions of the dummy piezoelectric vibrators and the drive piezoelectric vibrators.

8. The piezoelectric vibrator unit as set forth in claim 1, wherein connection electrodes are provided in each vibrator so as to be exposed at an end face of the fixed end portion thereof, and wherein the connection electrodes are on the same plane as the discrete internal electrodes while being insulated from respective internal electrodes.

9. The piezoelectric vibrator unit as set forth in claim 1, wherein the drive piezoelectric vibrators are arranged between a pair of dummy piezoelectric vibrators.

10. The piezoelectric vibrator unit as set forth in claim 2, wherein all the common internal electrodes are integrated without being separated by the grooves.

11. The piezoelectric vibrator unit as set forth in claim 1, wherein the conductive layer is formed on back faces of the dummy piezoelectric vibrators.

12. A piezoelectric vibrator unit as set forth in claim 11, wherein the conductive layer is electrically connected to the fixation base having conductivity.

13. The piezoelectric vibrator unit as set forth in claim 1, wherein the common internal electrodes of the drive piezoelectric vibrators and the internal electrodes of the dummy piezoelectric vibrators are integrated with each other at end faces of the fixed end portions thereof.

14. The piezoelectric vibrator unit as set forth in claim 1, wherein the conductive layer is formed so as to continuously extend from end faces of the free end portions of the dummy piezoelectric vibrators to end faces of the fixed end portions thereof for electrically connecting with the internal electrodes provided therein.

15. The piezoelectric vibrator unit as set forth in claim 1, wherein each common internal electrode in each drive vibrator is exposed at an end face of the fixed end portion thereof, and each discrete internal electrode in each drive vibrator is exposed at an end face of the free end portion thereof, wherein each internal electrode in each dummy piezoelectric vibrator is exposed at both of an end face of the fixed end portion and an end face of the free end portion thereof, and wherein the conductive layer is formed on at least the end face of the free end portion of the dummy piezoelectric vibrator.

16. The piezoelectric vibrator unit as set forth in claim 1, wherein the conductive layer is extended from the end faces of the free end portions to non-vibrating regions of the drive piezoelectric vibrators.

17. The piezoelectric vibrator unit as set forth in claim 1, wherein the conductive layer is extended from end faces of the free end portions to end faces of the fixed end portions of the dummy piezoelectric vibrators.

* * * * *